United States Patent
Kondo (10) Patent No.: US 7,115,518 B2
(45) Date of Patent: Oct. 3, 2006

(54) METHOD FOR FABRICATING SEMICONDUCTOR DEVICE COMPRISING FORMING HOLES IN A MULTI-LAYER INSULATING FILM

(75) Inventor: Keiichi Kondo, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 275 days.

(21) Appl. No.: 10/152,775

(22) Filed: May 23, 2002

(65) Prior Publication Data

US 2003/0092277 A1 May 15, 2003

(30) Foreign Application Priority Data

Oct. 2, 2001 (JP) .............................. 2001-306141

(51) Int. Cl.
*H01L 21/302* (2006.01)
(52) U.S. Cl. ..................... 438/706; 438/714; 438/723
(58) Field of Classification Search ................ 438/706, 438/710, 712, 714, 723, 724
See application file for complete search history.

(56) References Cited

U.S. PATENT DOCUMENTS

| | | | | |
|---|---|---|---|---|
| 5,366,590 A | * | 11/1994 | Kadomura | 438/723 |
| 5,445,712 A | * | 8/1995 | Yanagida | 438/695 |
| 5,767,017 A | * | 6/1998 | Armacost et al. | 438/694 |
| 6,171,974 B1 | * | 1/2001 | Marks et al. | 438/740 |
| 6,174,451 B1 | * | 1/2001 | Hung et al. | 216/67 |
| 6,211,092 B1 | * | 4/2001 | Tang et al. | 438/719 |
| 6,387,287 B1 | * | 5/2002 | Hung et al. | 216/67 |
| 6,569,774 B1 | * | 5/2003 | Trapp | 438/706 |
| 6,632,746 B1 | * | 10/2003 | Kanegae et al. | 438/706 |

FOREIGN PATENT DOCUMENTS

| | | | |
|---|---|---|---|
| JP | 10-144633 | | 5/1998 |
| JP | 10223605 | * | 8/1998 |
| JP | 2001-015488 | | 1/2001 |
| JP | 2001-210627 | | 8/2001 |
| JP | 2001-257261 | | 9/2001 |

* cited by examiner

*Primary Examiner*—Kin-Chan Chen
(74) *Attorney, Agent, or Firm*—McDermott Will & Emery LLP (57) ABSTRACT

After forming a first insulating film of a silicon nitride film, a silicon nitrided oxide film or a silicon carbide film, a second insulating film of a silicon oxide film is formed on the first insulating film. In a chamber of a high density plasma etching system, the second insulating film is selectively etched by using a first etching gas including a fluorocarbon gas having a cyclic structure as a principal constituent, so as to form an upper hole in the second insulating film. Subsequently, in the same chamber, the first insulating film is selectively etched by using a second etching gas including an oxygen gas as a principal constituent, so as to form a lower hole continuous to the upper hole in the first insulating film.

6 Claims, 9 Drawing Sheets

METHOD FOR FABRICATING SEMICONDUCTOR DEVICE COMPRISING FORMING HOLES IN A MULTI-LAYER INSULATING FILM

BACKGROUND OF THE INVENTION

The present invention relates to a method for fabricating a semiconductor device, and more particularly, it relates to a technique to form a hole in a multi-layer insulating film composed of a lower insulating film made from a silicon nitride film, a silicon nitrided oxide film or a silicon carbide film and an upper insulating film made from a silicon oxide film.

In accordance with a recently increased degree of integration of semiconductor integrated circuit devices, there are increasing demands for refinement of semiconductor devices included in semiconductor integrated circuit devices, and therefore, a hole formed in an insulating film is required to have a high aspect ratio.

For example, in accordance with increased refinement of a MOS field effect transistor included in a semiconductor integrated circuit device, a capacitor used in a DRAM is also required to be refined. Accordingly, a stacked memory device in which a memory cell is disposed on a word line has become a leading memory device.

Now, a general stacked memory device will be described with reference to FIG. 5.

Figure 5:
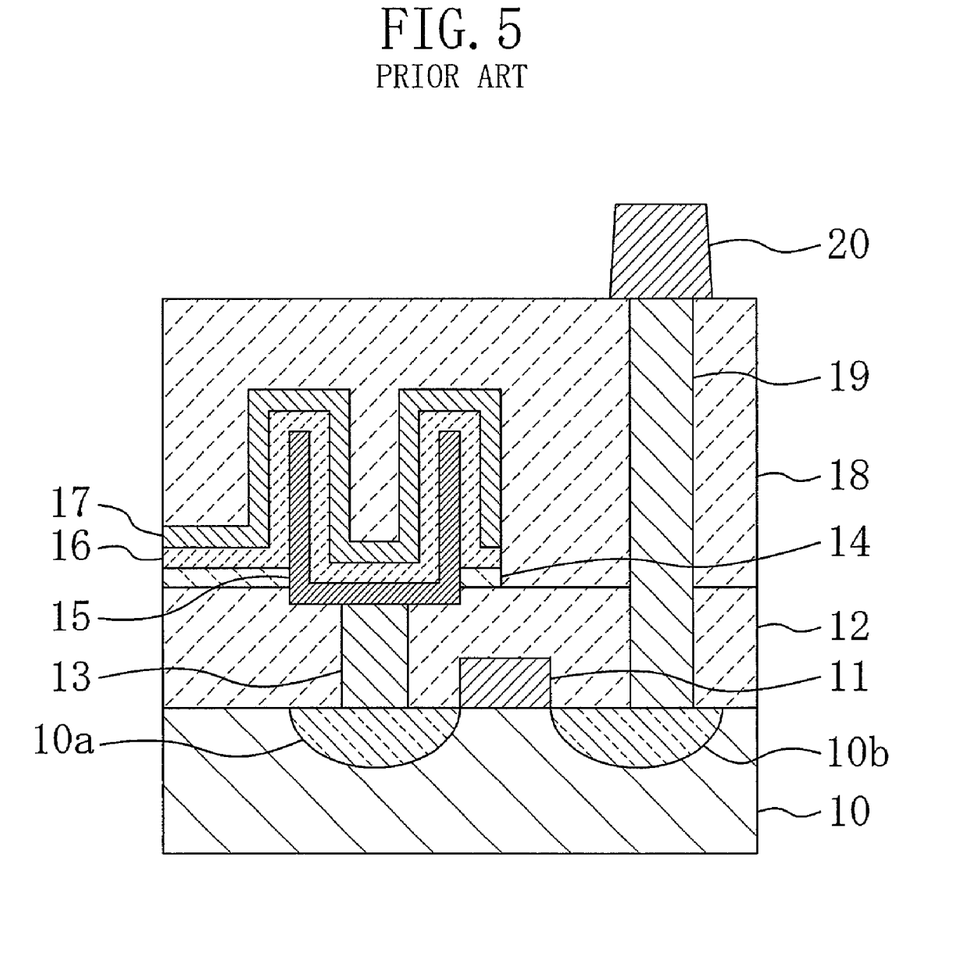
FIG. 5 is a cross-sectional view of a semiconductor device fabricated by the method for fabricating a semiconductor device of the embodiment and by a conventional method for fabricating a semiconductor device.

As shown in FIG. 5, a word line (gate electrode) 11 of a polysilicon film is formed on a semiconductor substrate 10 of a silicon substrate in which impurity diffusion layers 10a and 10b working as the source and the drain are formed, and a first interlayer insulating film 12 is deposited so as to cover the word line 11. A first contact 13 of a polysilicon film with its lower end connected to one impurity diffusion layer 10a is buried in the first interlayer insulating film 12.

A first insulating film 14 of, for example, a silicon nitride film working as an etching stopper film is deposited on the first interlayer insulating film 12, and a capacitor including a storage electrode 15, a capacitor dielectric film 16 and a plate electrode 17 is provided on the first interlayer insulating film 12. A second interlayer insulating film 18 is deposited on the first insulating film 14 so as to cover the capacitor. The upper end of the first contact 13 is connected to the storage electrode 15.

A second contact 19 with its lower end connected to the other impurity diffusion layer 10b is buried in the first interlayer insulating film 12, the first insulating film 14 and the second interlayer insulating film 18. A bit line 20 is provided on the second interlayer insulating film 18 so as to be connected to the upper end of the second contact 19.

Next, a conventional method for fabricating a stacked memory cell will be described. Beforehand, etching systems used in the conventional method for fabricating a stacked memory cell will be described with reference to FIGS. 9A and 9B.

Figure 9A:
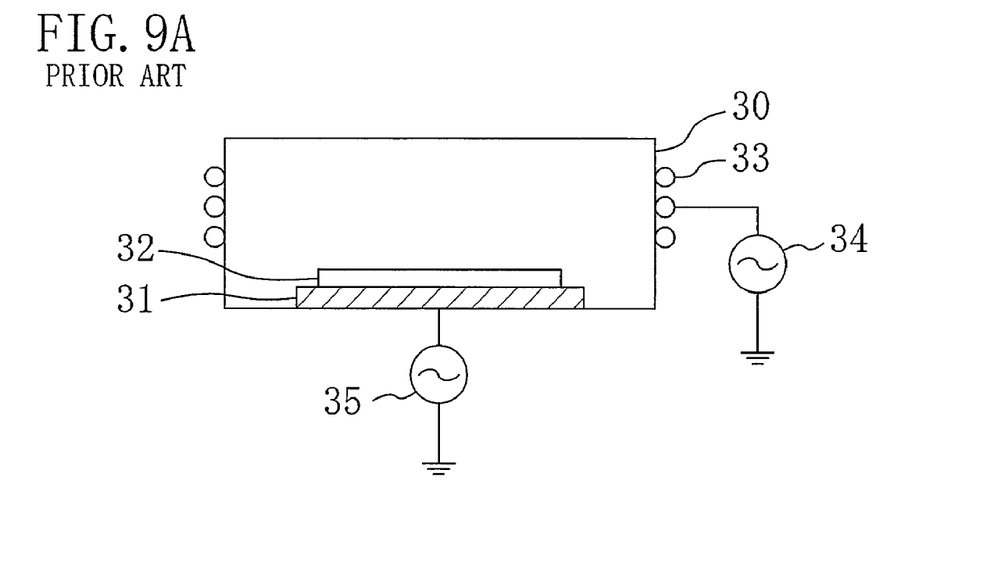
FIGS. 9A and 9B are rough cross-sectional views of an inductively coupled plasma etching system and a diode parallel plate RIE system, respectively.

FIG. 9A shows a rough cross-sectional structure of an inductively coupled plasma (ICP) etching system, that is, a high density plasma etching system. A lower electrode (sample table) 31 is provided in a lower portion of a chamber 30, and a semiconductor substrate 32 to be etched is held on the lower electrode 31. An induction coil 33 is provided on the outer face of the chamber 30, and RF power of 2.0 MHz is applied to the induction coil 33 by a first RF power supply 34. Also, RF power of 1.8 MHz is applied to the lower electrode 31 by a second RF power supply 35.

Figure 9B:
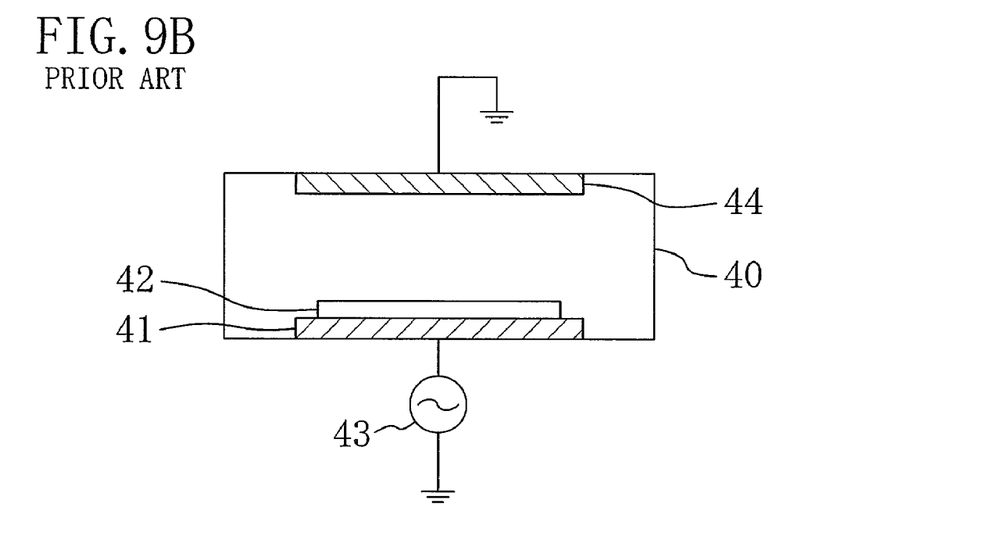

FIG. 9B shows a rough cross-sectional structure of a diode parallel plate RIE system, that is, a low density plasma etching system. A lower electrode (sample table) 41 is provided in a lower portion of a chamber 40, and a semiconductor substrate 42 to be etched is held on the lower electrode 41. RF power of 13.5 MHz is applied to the lower electrode 41 by an RF power supply 43. Also, an upper electrode 44 is provided in an upper portion of the chamber 40, and the upper electrode 44 is grounded.

Now, the conventional method for fabricating a memory cell by using the two kinds of etching systems of FIGS. 9A and 9B will be described with reference to FIGS. 6A through 6D, 7A through 7D and 8A through 8D.

Figure 6A:
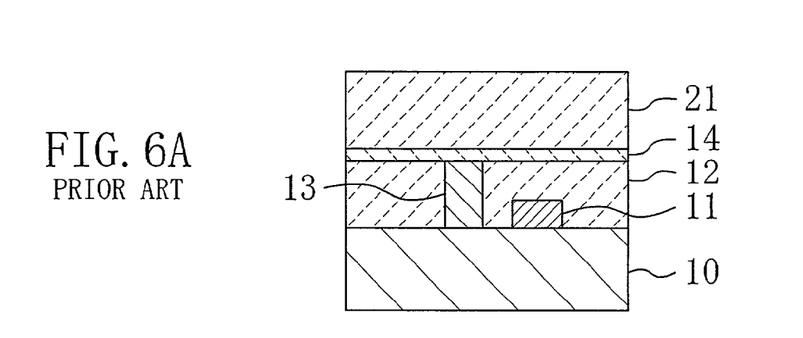
FIGS. 6A, 6B, 6C and 6D are cross-sectional views for showing procedures in the conventional method for fabricating a semiconductor device.

First, as shown in FIG. 6A, after forming a word line 11 on a semiconductor substrate 10, a first interlayer insulating film 12 is deposited on the semiconductor substrate 10 so as to cover the word line 11. Thereafter, a first contact 13 of a polysilicon film is buried in the first interlayer insulating film 12 so as to be connected to one impurity diffusion layer 10a at its lower end.

Next, a first insulating film 14 of, for example, a silicon nitride film working as an etching stopper film and a second insulating film 21 of, for example, a silicon oxide film are successively deposited on the first interlayer insulating film 12.

Figure 6B:
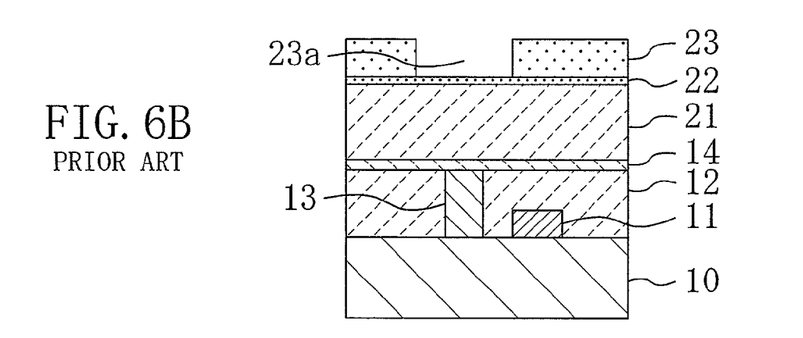

Then, as shown in FIG. 6B, after an anti-reflection film 22 of an organic film is formed on the second insulating film 21, a first resist pattern 23 having a hole opening 23a is formed on the anti-reflection film 22.

Figure 6C:
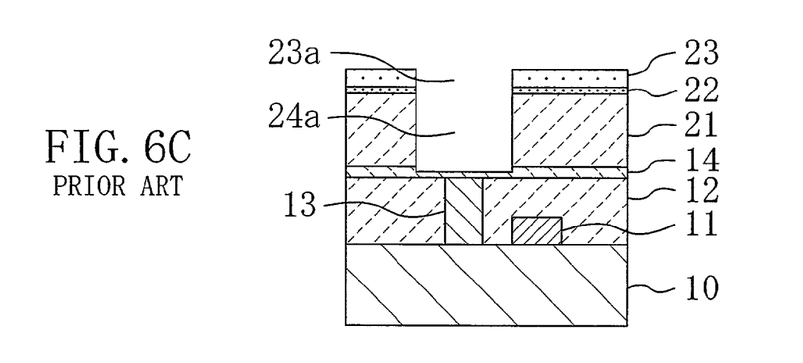

Subsequently, by using the inductively coupled plasma etching system of FIG. 9A, the anti-reflection film 22 and the second insulating film 21 are successively etched with the first resist pattern 23 used as a mask, so as to form an upper hole 24a in the second insulating film 21 as shown in FIG. 6C.

The etching conditions for this etching are as follows: The pressure within the chamber 30 is set to 1.33 Pa; RF power (coil power) of 2700 W is applied to the induction coil 33 by the first RF power supply 34; and RF power (bias power) of 1300 W is applied to the lower electrode 31 by the second RF power supply 35.

In the etching of the anti-reflection film 22, a first etching gas of a mixture of a $C_2F_6$ gas (with a flow rate of 40 ml/min. (standard condition)) and an $O_2$ gas (with a flow rate of 5 ml/min. (standard condition)) is introduced into the chamber 30. In the etching of the second insulating film 21, a second etching gas of a mixture of a $C_2F_6$ gas (with a flow rate of 40 ml/min. (standard condition)) and an $O_2$ gas (with a flow rate of 2 ml/min. (standard condition)) is introduced into the chamber 30. Thus, the anti-reflection film 22 and the second insulating film 21 can be successively etched, and the etching can be definitely ended on the top face of the first insulating film 14.

Figure 6D:
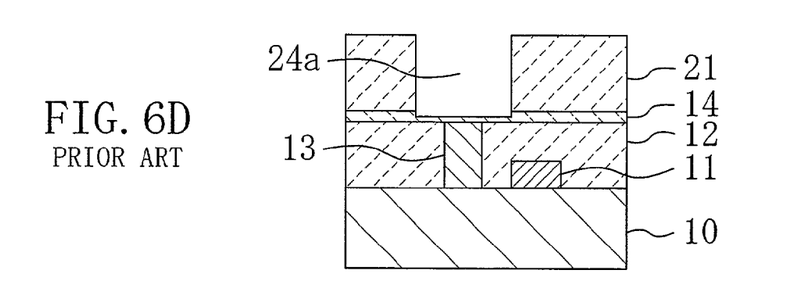

Next, as shown in FIG. 6D, the resist pattern 23 and the anti-reflection film 22 are removed by ashing using oxygen plasma, and the resultant substrate is cleaned.

Figure 7A:
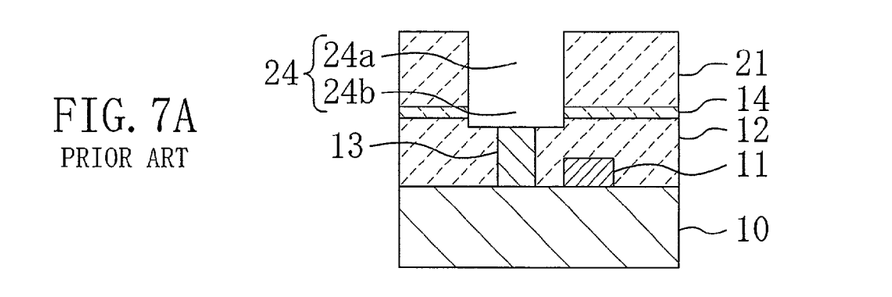
FIGS. 7A, 7B, 7C and 7D are cross-sectional views for showing other procedures in the conventional method for fabricating a semiconductor device.

Thereafter, by using the diode parallel plate RIE system of FIG. 9B, the first insulating film 14 is etched by using, as a mask, the second insulating film 21 in which the upper hole 24a has been formed (namely, the patterned second insulating film) as shown in FIG. 7A, so as to form a lower hole 24b in the first insulating film 14. Then, etching residues are removed by the ashing. Thus, a hole 24 composed of the upper hole 24a and the lower hole 24b is formed.

The etching conditions for the etching of the first insulating film 14 are as follows: The pressure within the chamber 40 is set to 5 Pa; RF power of 600 W is applied to the lower electrode 41 by the RF power supply 43; and a third etching gas of a mixture of a $CHF_3$ gas (with a flow rate of 110 ml/min. (standard condition)) and an $O_2$ gas (with a flow rate of 12 ml/min. (standard condition)) is introduced into the chamber 40.

Also, the conditions for the ashing are as follows: The pressure within the chamber 40 is set to 133 Pa; RF power of 100 W is applied to the lower electrode 41 by the RF power supply 43; and a fourth etching gas of a mixture of a $CF_4$ gas (with a flow rate of 100 ml/min. (standard condition)) and an $O_2$ gas (with a flow rate of 100 ml/min. (standard condition)) is introduced into the chamber 40.

Figure 7B:
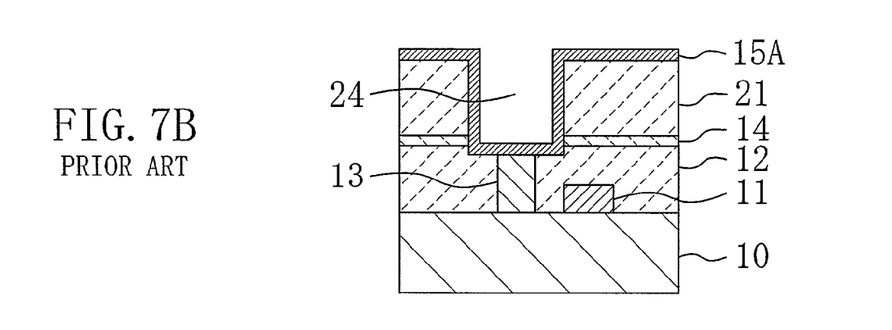
Figure 7C:
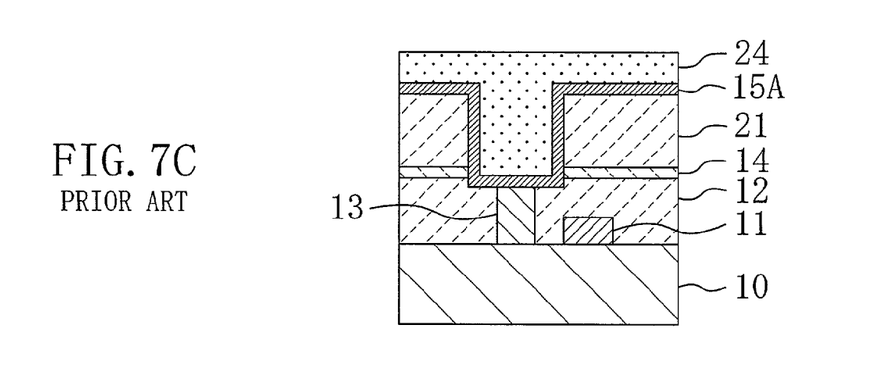

Next, as shown in FIG. 7B, a first polysilicon film 15A doped with, for example, phosphorus is deposited on the top face of the second insulating film 21 and on the wall and the bottom of the hole 24. Thereafter, a second resist pattern 24 is formed on the first polysilicon film 15A as shown in FIG. 7C.

Figure 7D:
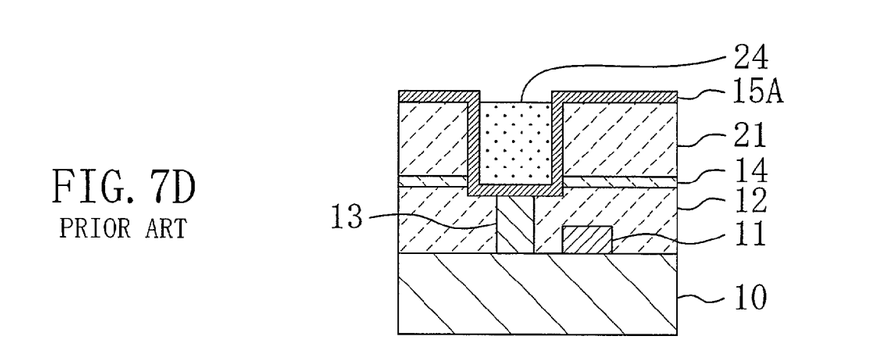

Then, as shown in FIG. 7D, the second resist pattern 24 is etched back, so that a storage electrode forming region (corresponding to a portion present within the hole 24) of the second resist pattern 24 can remain. In other words, a portion of the first polysilicon film 15A present on the second insulating film 21 is exposed. This procedure is performed in order to protect a portion of the first polysilicon film 15A to be formed into a storage electrode in subsequently performed etching of the first polysilicon film 15A.

Figure 8A:
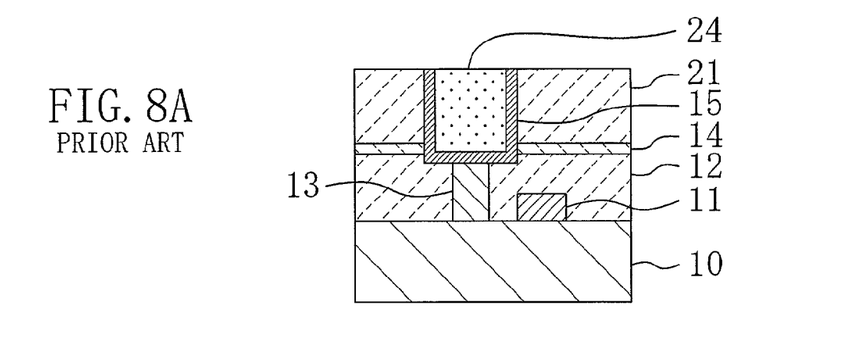
FIGS. 8A, 8B, 8C and 8D are cross-sectional views for showing other procedures in the conventional method for fabricating a semiconductor device.
Figure 8B:
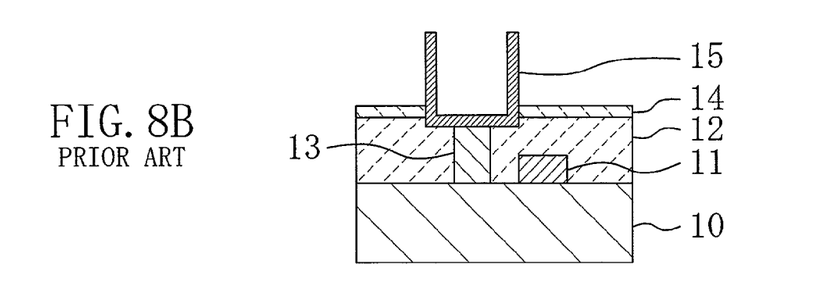

Next, as shown in FIG. 8A, the first polysilicon film 15A is etched by using the second resist pattern 24 as a mask, so as to form a storage electrode 15 in a bottomed cylindrical shape (with a U-shaped cross-section) from the first polysilicon film 15A. Thereafter, the second insulating film 21 and the second resist pattern 24 are removed by a vapor HF treatment, so as to expose the storage electrode 15 as shown in FIG. 8B.

Figure 8C:
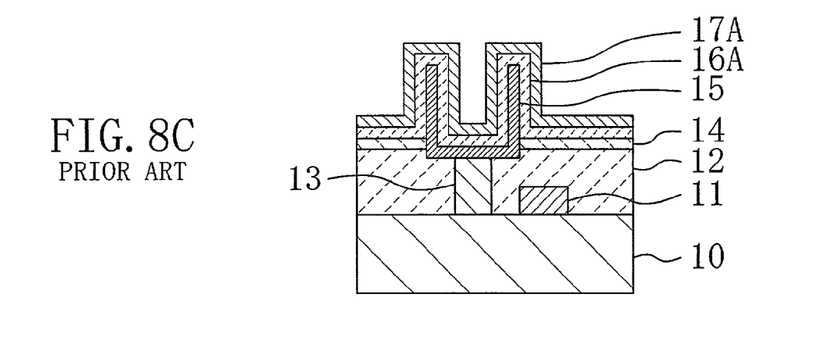
Figure 8D:
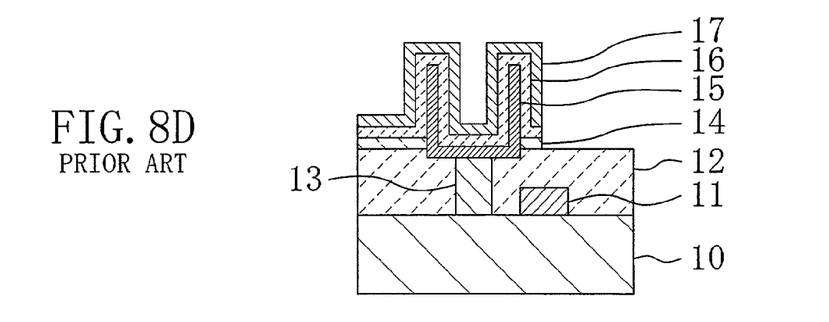

Then, as shown in FIG. 8C, for example, a silicon nitrided oxide film 16A and a second polysilicon film 17A doped with, for example, phosphorus are successively deposited over the storage electrode 15 and the first insulating film 14. Thereafter, the second polysilicon film 17A, the silicon nitrided oxide film 16A and the first insulating film 14 are patterned, thereby forming a plate electrode 17 from the second polysilicon film 17A and a capacitor dielectric film 16 from the silicon nitrided oxide film 16A as shown in FIG. 8D.

Subsequently, although not shown in the drawings, a second interlayer insulating film 18, a second contact 19 and a bit line 20 are formed, resulting in completing the semiconductor device of FIG. 5.

In the aforementioned stacked memory device, the capacitance of the capacitor is determined depending upon the area of a portion where the storage electrode 15 opposes the plate electrode 17, namely, the height of the storage electrode 15. The height of the storage electrode 15 depends upon the depth of the hole 24. Accordingly, in order to attain constant capacitance of the capacitor, it is very significant to control the depth of the hole 24 to be constant.

Therefore, the first insulating film 14 working as an etching stopper film in the etching of the second insulating film 21 is formed below the second insulating film 21. However, since the first insulating film 14 is present below the second insulating film 21, it is necessary, for forming the hole 24, to etch the first insulating film 14 in addition to the second insulating film 21.

In the etching of the second insulating film 21, the second etching gas of a mixture of a $C_2F_6$ gas and an $O_2$ gas is introduced into the chamber 30 of the inductively coupled plasma etching system, so as to generate high density plasma to be used for the etching.

In the etching of the first insulating film 14, the third etching gas of a mixture of a $CHF_3$ gas and an $O_2$ gas is introduced into the chamber 40 of the diode parallel plate RIE system, so as to generate low density plasma to be used for the etching.

The reasons why the different etching systems are thus used in the etching of the second insulating film 21 and in the etching of the first insulating film 14 will now be described.

The first reason is as follows: Since the second insulating film 21 has a comparatively large thickness, the etching time is too long if it is etched by using low density plasma. Accordingly, the second insulating film 21 is etched preferably by using high density plasma. In contrast, the first insulating film 14 has a comparatively small thickness. Therefore, if it is etched by using high density plasma, the etching rate is varied in the substrate plane, and hence, the depth of the hole 24 is varied and the etching end point is difficult to detect. Accordingly, the first insulating film 14 is etched preferably by using low density plasma.

The second reason is as follows: Since the second insulating film 21 is made from a silicon oxide film, it is necessary to use the etching gas of a mixture of a $C_2F_6$ gas and an $O_2$ gas in the etching of the second insulating film 21. On the other hand, since the first insulating film 14 is made from a silicon nitride film, it is necessary to use the etching gas of a mixture of a $CHF_3$ gas and an $O_2$ gas in the etching of the first insulating film 14. Thus, it is necessary to change the etching gas between the etching of the second insulating film 21 and the etching of the first insulating film 14.

For these reasons, the different etching systems are used in the etching of the second insulating film 21 and the etching of the first insulating film 14. However, the use of the different etching systems increases the number of procedures and also largely increases the time required for forming a hole (turn around time; TAT).

Also in the case where the first insulating film 14 is made from a silicon nitrided oxide film or a silicon carbide film instead of a silicon nitride film, the same problems arise.

SUMMARY OF THE INVENTION

In consideration of the aforementioned problems, an object of the invention is forming a hole by etching a first insulating film made from a silicon nitride film, a silicon nitrided oxide film or a silicon carbide film and a second insulating film made from a silicon oxide film formed on the first insulating film by using the same plasma etching system.

In order to achieve the object, the method for fabricating a semiconductor device of this invention comprises the steps of forming a first insulating film made from a silicon nitride film, a silicon nitrided oxide film or a silicon carbide film; forming a second insulating film made from a silicon oxide film on the first insulating film; forming an upper hole in the second insulating film by performing selective etching on the second insulating film in a chamber of a high density plasma etching system by using a first etching gas including a fluorocarbon gas having a cyclic structure as a principal constituent; and forming a lower hole continuous to the upper hole in the first insulating film by performing selective etching on the first insulating film in the chamber by using a second etching gas including an oxygen gas as a principal constituent.

In the method for fabricating a semiconductor device of this invention, after etching the second insulating film of a silicon oxide film by using the first etching gas including a fluorocarbon gas having a cyclic structure as a principal constituent, the first insulating film of a silicon nitride film, a silicon nitrided oxide film or a silicon carbide film is etched by using the second etching gas including an oxygen gas as a principal constituent. Therefore, the second insulating film and the first insulating film can be continuously etched in the same chamber of the high density plasma etching system.

Accordingly, in the method for fabricating a semiconductor device of this invention, the number of procedures required for forming a hole can be reduced and time required for forming a hole can be largely reduced.

In the method for fabricating a semiconductor device, the first insulating film is preferably formed on a silicon oxide film in the step of forming a first insulating film.

Thus, the silicon oxide film is present below the first insulating film of a silicon nitride film, a silicon nitrided oxide film or a silicon carbide film, and hence, the silicon oxide film works as an etching stopper in the etching of the second insulating film.

In the method for fabricating a semiconductor device, the second etching gas preferably includes substantially an oxygen gas alone.

Thus, the etching rate of the second insulating film can be definitely larger than the etching rate of another film present on or below the second insulating film, so that the etch selectivity can be increased.

In the method for fabricating a semiconductor device, when the second etching gas includes substantially an oxygen gas alone, the first insulating film is preferably formed on a silicon oxide film in the step of forming a first insulating film.

Thus, the silicon oxide film can definitely work as an etching stopper in the etching of the second insulating film.

DETAILED DESCRIPTION OF THE INVENTION

A method for fabricating a semiconductor device according to an embodiment of the invention will now be described with reference to FIGS. 1A through 1D, 2A through 2D, 3A through 3D and 4A through 4D.

Figure 1A:
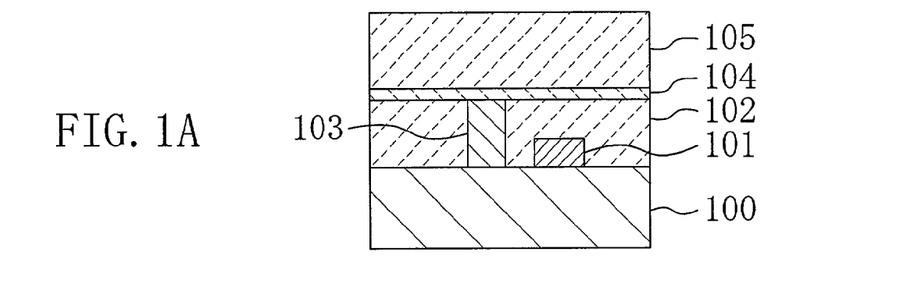
FIGS. 1A, 1B, 1C and 1D are cross-sectional views for showing procedures in a method for fabricating a semiconductor device according to an embodiment of the invention.

First, as shown in FIG. 1A, after forming a word line 101 of a polysilicon film on a semiconductor substrate 100 of a silicon substrate in which impurity diffusion layers (not shown) are formed, a first interlayer insulating film 102 of a silicon oxide film is deposited so as to cover the word line 101. Then, after forming a contact hole in the first interlayer insulating film 102, a polysilicon film is filled in the contact hole so as to form a contact plug 103. Thereafter, a first insulating film 104 of a silicon nitride film with a thickness of 50 nm working as an etching stopper film is deposited on the first interlayer insulating film 102 by, for exampled, reduced pressure CVD. Then, a second insulating film 105 of a silicon oxide film doped with boron (1.5 wt %) and phosphorus (4.0 wt %) and having a thickness of 650 nm is deposited on the first insulating film 104 by, for example, CVD.

Figure 1B:
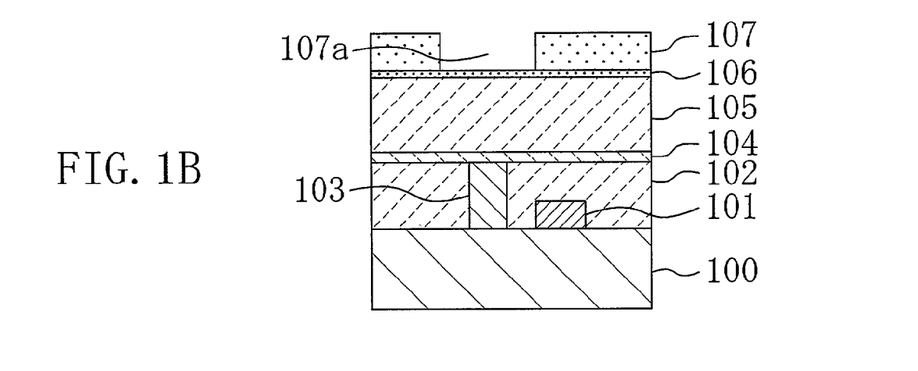

Next, as shown in FIG. 1B, after applying an anti-reflection film 106 of an organic material film with a thickness of, for example, 80 nm on the second insulating film 105, a first resist pattern 107 having a hole opening 107a is formed on the anti-reflection film 106.

Figure 1C:
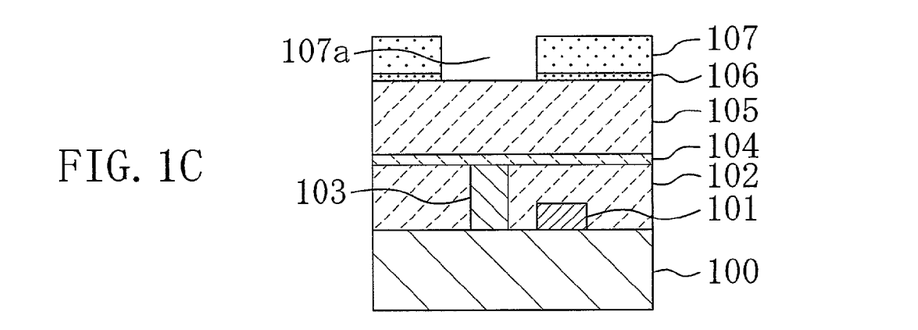

Then, as shown in FIG. 1C, the anti-reflection film 106 is etched by using the first resist pattern 107 as a mask, thereby transferring the opening 107a of the first resist pattern 107 onto the anti-reflection film 106. This etching is performed by using the inductively coupled plasma etching system of FIG. 9A under the following conditions: A first etching gas of a mixture of a $C_5F_8$ gas (with a flow rate of 15 ml/min. (standard condition)), an Ar gas (with a flow rate of 80 m/min. (standard condition)) and an $O_2$ gas (with a flow rate of 5 ml/min. (standard condition)) is introduced into the chamber within which the pressure is set to 1.33 Pa; RF power of 2.0 MHz is applied to the induction coil 33 by the first RF power supply 34 with power of 2.2 kW; and RF power of 1.8 MHz is applied to the lower electrode 31 by the second RF power supply 35 with power of 1.3 kW.

Figure 1D:
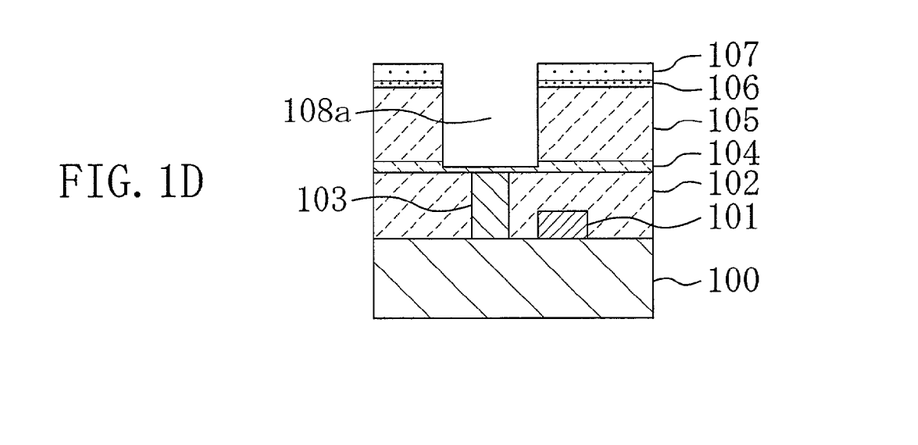

Next, as shown in FIG. 1D, the second insulating film 105 is etched by using the first resist pattern 107 as a mask, thereby forming an upper hole 108a in the second insulating film 105. In this etching, the first insulating film 104 works as the etching stopper film.

Also, this etching is performed by using the inductively coupled plasma etching system of FIG. 9A under the following conditions: A second etching gas of a mixture of a $C_5F_8$ gas (with a flow rate of 15 ml/min. (standard condition)), an Ar gas (with a flow rate of 80 ml/min. (standard condition)) and an $O_2$ gas (with a flow rate of 2 ml/min. (standard condition)) is introduced into the chamber within which the pressure is set to 1.33 Pa; RF power of 2.0 MHz is applied to the induction coil 33 by the first RF power supply 34 with power of 2.2 kW; and RF power of 1.8 MHz is applied to the lower electrode 31 by the second RF power supply 35 with power of 1.3 kW.

In the second etching gas, the mixing ratio of the $O_2$ gas is lower than in the first etching gas. In other words, the mixing ratio of the $O_2$ gas is higher in the first etching gas than in the second etching gas. Therefore, the anti-reflection film 106 made from the organic material film can be efficiently etched. Also, the anti-reflection film 106 and the second insulating film 105 can be continuously etched by obtaining the second etching gas by reducing the ratio of the $O_2$ gas included in the first etching gas.

Figure 2A:
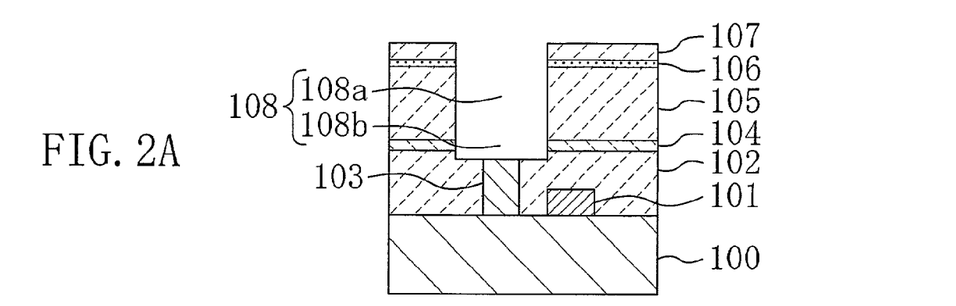
FIGS. 2A, 2B, 2C and 2D are cross-sectional views for showing other procedures in the method for fabricating a semiconductor device of the embodiment.

Next, as shown in FIG. 2A, the first insulating film 104 is etched by using the first resist pattern 107 as a mask, so as to form a lower hole 108b in the first insulating film 104. Thus, a hole 108 composed of the upper hole 108a and the lower hole 108b can be obtained.

This etching is performed by using the inductively coupled plasma etching system of FIG. 9A under the following conditions: A third etching gas of an $O_2$ gas (with a flow rate of 300 ml/min. (standard condition)) is introduced into the chamber within which the pressure is set to 2 Pa; RF power of 2.0 MHz is applied to the induction coil 33 by the first RF power supply 34 with power of 2.5 kW; and RF power of 1.8 MHz is applied to the lower electrode 31 by the second RF power supply 35 with power of 0.25 kW.

In this manner, the first insulating film 104 can be satisfactorily etched, and the mechanism will be described later.

Figure 2B:
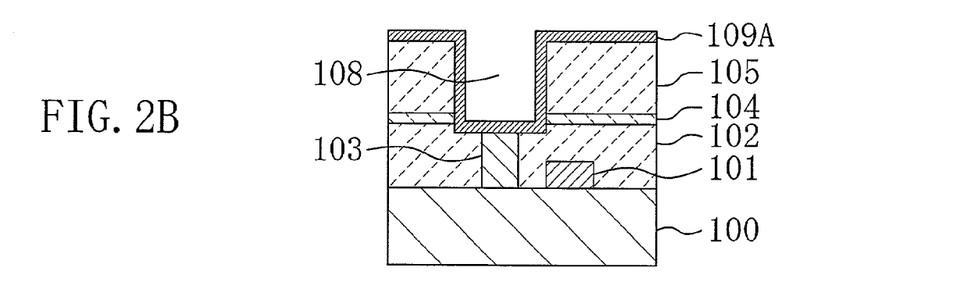

Then, as shown in FIG. 2B, after removing the first resist pattern 107 and the anti-reflection film 106 by ashing, the inside of the hole 108 and the top face of the second insulating film 105 are cleaned, so as to remove the remaining resist material and polymer components. Thereafter, a first polysilicon film 109A doped with, for example, phosphorus is deposited over the top face of the second insulating film 105 and the bottom and the wall of the hole 108.

Figure 2C:
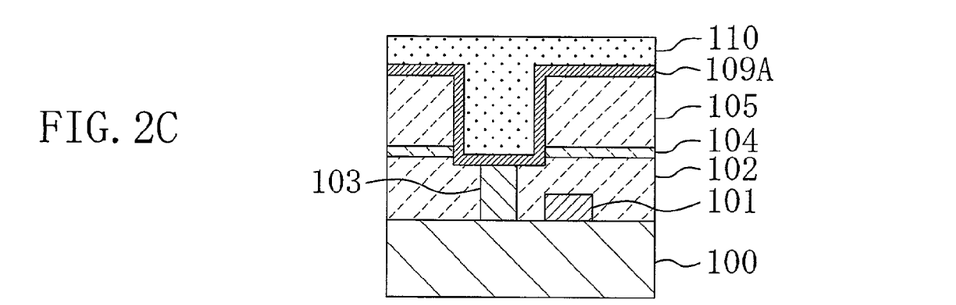
Figure 2D:
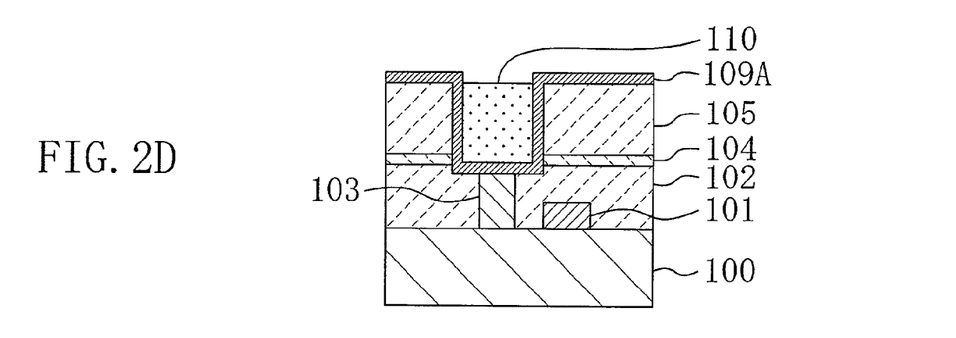

Subsequently, a second resist pattern 110 is formed on the first polysilicon film 109A as shown in FIG. 2C, and the second resist pattern 110 is etched back so as to allow a storage electrode forming portion (namely, a portion present within the hole 108) of the second resist pattern 110 to remain as shown in FIG. 2D. This procedure is performed in order to protect a portion of the first polysilicon film 109A formed into a storage electrode in subsequent etching of the first polysilicon film 109A.

Figure 3A:
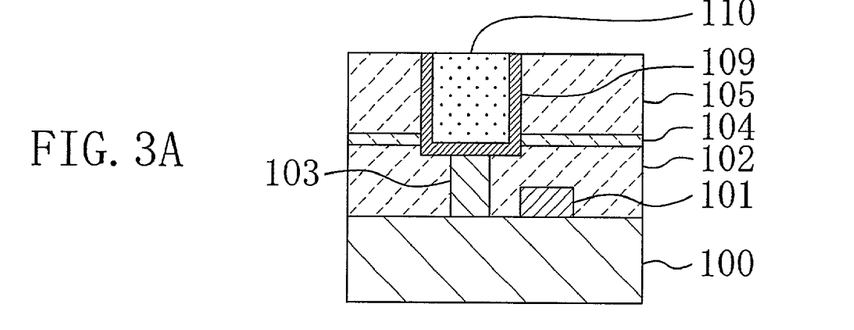
FIGS. 3A, 3B, 3C and 3D are cross-sectional views for showing other procedures in the method for fabricating a semiconductor device of the embodiment.
Figure 3B:
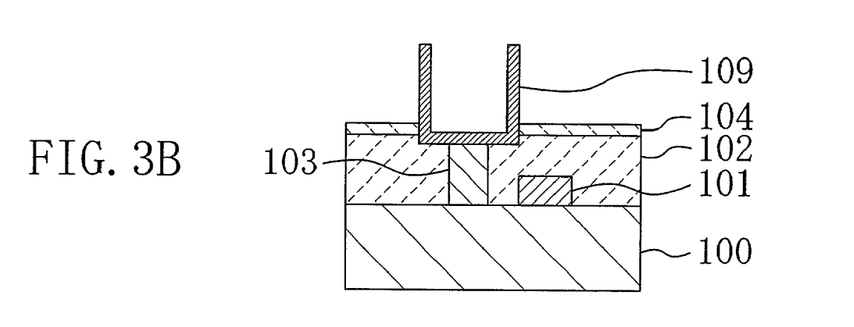

Next, as shown in FIG. 3A, the first polysilicon film 109A is etched by using the second resist pattern 110 as a mask, so as to form a storage electrode 109 in a bottomed cylindrical shape (with a U-shaped cross-section) from the first polysilicon film 109A. Then, as shown in FIG. 3B, the second insulating film 105 and the second resist pattern 110 are removed by a vapor HF treatment so as to expose the storage electrode 109.

Figure 3C:
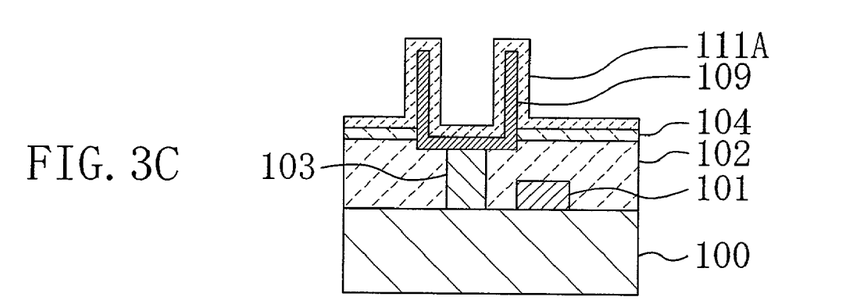
Figure 3D:
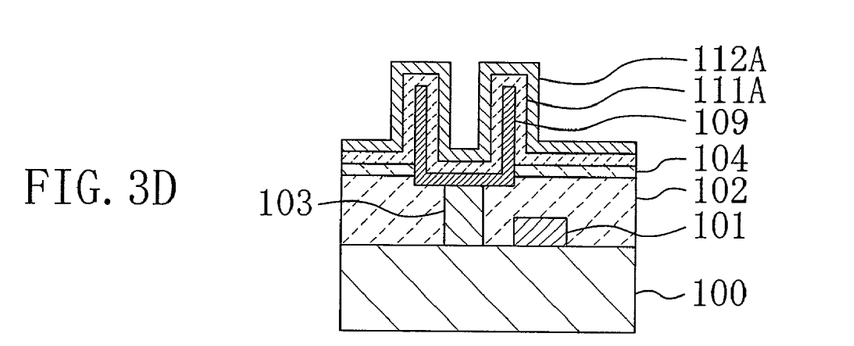

Then, for example, a silicon nitrided oxide film 111A is deposited over the storage electrode 109 and the first insulating film 104 as shown in FIG. 3C, and a second polysilicon film 112A doped with, for example, phosphorus is deposited over the silicon nitrided oxide film 111A as shown in FIG. 3D.

Figure 4A:
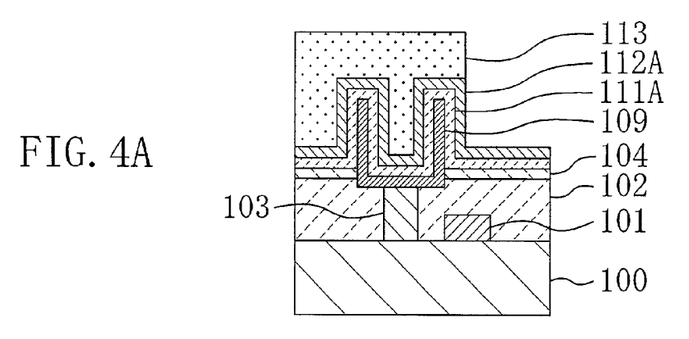
FIGS. 4A, 4B, 4C and 4D are cross-sectional views for showing other procedures in the method for fabricating a semiconductor device of the embodiment.
Figure 4B:
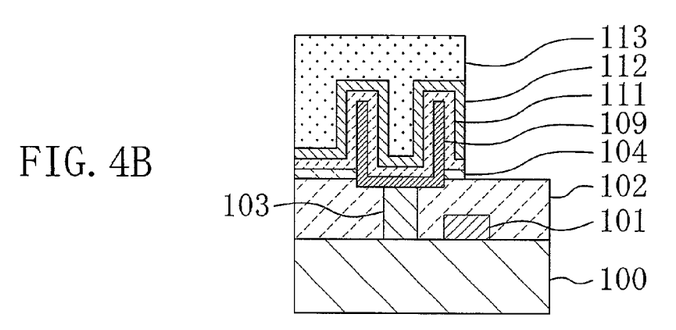

Subsequently, a third resist pattern 113 is formed on the second polysilicon film 112A as shown in FIG. 4A, and the second polysilicon film 112A, the silicon nitrided oxide film 111A and the first insulating film 104 are successively etched by using the third resist pattern 113 as a mask as shown in FIG. 4B. Thus, the second polysilicon film 112A is formed into a plate electrode 112 and the silicon nitrided oxide film 111A is formed into a capacitor dielectric film 111. In this manner, a capacitor device composed of the storage electrode 109, the capacitor dielectric film 111 and the plate electrode 112 is obtained.

Figure 4C:
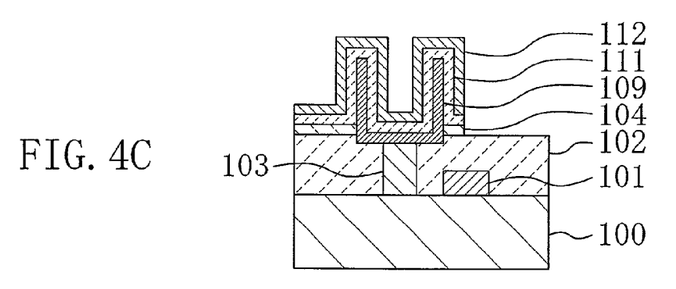
Figure 4D:
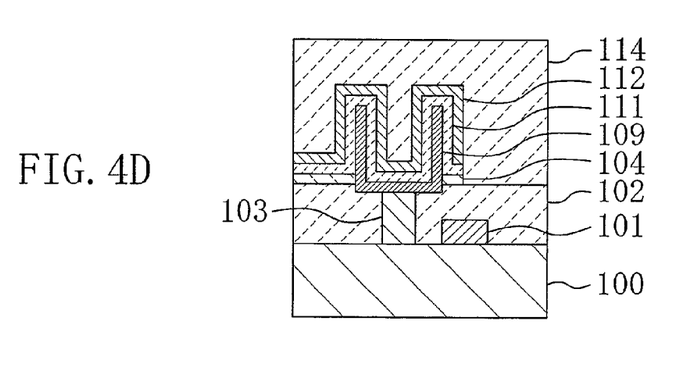

Next, after removing the third resist pattern 113 as shown in FIG. 4C, a second interlayer insulating film 114 is deposited on the capacitor device and the first interlayer insulating film 102 as shown in FIG. 4D. Thus, a semiconductor device of this embodiment is completed.

Now, the mechanism by which the first insulating film 104 can be satisfactorily etched if it is etched by introducing, into the chamber of the same inductively coupled plasma etching system, the etching gas including an oxygen gas as a principal constituent after etching the second insulating film 105 by introducing the etching gas including, as a principal constituent, a fluorocarbon gas having a cyclic structure (namely, the mixed gas of a $C_5F_8$ gas, an Ar gas and an $O_2$ gas) will be described.

First, when the second insulating film 105 is etched by using an etching gas including, as a principal constituent, a fluorocarbon gas having a cyclic structure such as a $C_5F_8$ gas, the $C_5F_8$ gas is decomposed to generate radicals such as $F^*$, $CF^*$, $CF_2^*$ and $CF_3^*$, and the generated radicals form a polymer represented by the following Chemical Formula 1. The polymer represented by Chemical Formula 1 is adhered onto the wall and the bottom of the upper hole 108a formed in the second insulating film 105.

Chemical Formula 1:

Next, when the first insulating film 104 is etched by using an etching gas including an $O_2$ gas a principal constituent, the polymer represented by Chemical Formula 1 adhered onto the wall and the bottom of the upper hole 108a and $O_2$ included in the etching gas are bonded to each other as represented by Chemical Formula 2. As a result, $CF^*$ included in Chemical Formula 1 is changed into $CO^*$ and $F^*$ is released from the polymer represented by Chemical Formula 1 as represented by Chemical Formula 3.

Chemical Formula 2:

Chemical Formula 3:

Thereafter, the released $F^*$ etches the first insulating film 104, and hence, the lower hole 108b is formed in the first insulating film 104. This phenomenon occurs because the bond energy between a silicon atom and a nitrogen atom included in the silicon nitride film of the first insulating film 104 is smaller than the bond energy between a silicon atom and an oxygen atom included in a silicon oxide film.

Accordingly, by merely changing the principal constituent of the etching gas in the chamber of the same inductively coupled plasma etching system, namely, by increasing the supply of the $O_2$ gas with the supply of the $C_5F_8$ gas and the Ar gas included in the etching gas (i.e., the mixture of the $C_5F_8$ gas, the Ar gas and the $O_2$ gas) used for etching the second insulating film 105 stopped, the second insulating film 105 and the first insulating film 104 can be continuously etched.

The etching gas including an $O_2$ gas as a principal constituent exhibits a low etching rate against a silicon oxide film. Therefore, the first interlayer insulating film 102 of the silicon oxide film can work as the etching stopper film in the etching of the second insulating film 105.

In the case where the etching gas including an $O_2$ gas as a principal constituent is composed of substantially an $O_2$ gas alone, the first interlayer insulating film 102 made from a silicon oxide film can work as a good etching stopper film.

The etching gas including an $O_2$ gas as a principal constituent may include a small amount of fluorocarbon gas. Although the first interlayer insulating film 102 is slightly etched in this case, the etching rate of the first insulating film 104 can be high.

As the fluorocarbon gas having a cyclic structure, any of those represented by Chemical Formulas 4, 5, 6 and 7 may be appropriately used.

Also, although the ICP etching system is used as an apparatus for performing high density plasma etching in this embodiment, a TCP (transformer coupled plasma) etching system, an ECR (electron cyclotron resonance) etching system, a magnetron RIE (reactive ion etcher) system or an SWP (surface wave plasma) etching system may be used instead.

Furthermore, although the first insulating film 104 working as the etching stopper film is made from a silicon nitride film in this embodiment, the same effect can be attained by using a silicon nitrided oxide film or a silicon carbide film as the first insulating film 104.

Moreover, the hole is formed for forming the storage capacitor included in the memory device in this embodiment, the hole may be formed for forming a contact for connection to an impurity diffusion layer, a contact for connection to the top face of a gate electrode or a contact for connection between an upper interconnect and a lower interconnect instead.

What is claimed is:

1. A method for fabricating a semiconductor device comprising the steps of:
   forming a first insulating film made from a silicon nitride film, a silicon nitride oxide film or silicon carbide film on an insulating film made from a silicon oxide film with which a contact plug is formed;
   forming a second insulating film made from a silicon oxide film on said first insulating film;
   forming an upper hole in said second insulating film by performing selective etching on said second insulating film in a chamber of a high density plasma etching system by using a first etching gas including a fluorocarbon gas having a cyclic structure as a principal constituent;
   forming a lower hole continuous to said upper hole in said first insulating film to expose the contact plug and the insulating film with which the contact plug is formed by performing selective etching on said first insulating film in said chamber by using a second etching gas including an oxygen gas as a principle constituent; and
   forming a storage electrode of a capacitor on a bottom and a wall of a hole consisting of the upper hole and the lower hole,
   wherein said second etching gas exhibits an etching rate against said insulating film lower than said first insulating film.

2. The method for fabricating a semiconductor device of claim 1, wherein the fluorocarbon gas is represented by the formula of $C_xF_y$ (where y>x+2, x and y being natural numbers).

3. The method for fabricating a semiconductor device of claim 1, wherein the fluorocarbon gas is at least a gas selected from the group consisting of $C_5F_{10}$ and $C_6F_{12}$.

4. The method for fabricating a semiconductor device of claim 1, wherein the fluorocarbon gas is $C_5F_8$.

5. The method for fabricating a semiconductor device of claim 1, wherein the step of forming said lower hole is started in a state where a polymer is adhered onto a wall of said upper hole in said second insulating film.

6. The method for fabricating a semiconductor device of claim 1, wherein said second etching gas is composed of substantially an $O_2$ gas alone.

* * * * *